(12) United States Patent
Ong et al.

(10) Patent No.: US 6,770,904 B2
(45) Date of Patent: Aug. 3, 2004

(54) POLYTHIOPHENES AND ELECTRONIC DEVICES GENERATED THEREFROM

(75) Inventors: Beng S. Ong, Mississauga (CA); Ping Liu, Mississauga (CA); Lu Jiang, Oakville (CA); Yu Qi, Mississauga (CA); Yiliang Wu, Mississauga (CA)

(73) Assignee: Xerox Corporation, Stanford, CT (US)

( * ) Notice: Subject to any disclaimer, the term of this patent is extended or adjusted under 35 U.S.C. 154(b) by 0 days.

(21) Appl. No.: 10/042,358

(22) Filed: Jan. 11, 2002

(65) Prior Publication Data

US 2003/0160230 A1 Aug. 28, 2003

(51) Int. Cl.$^7$ .......... H01L 35/24; H01L 51/00; H01L 51/40; C08G 75/00
(52) U.S. Cl. .......... 257/40; 438/99; 528/373
(58) Field of Search .......... 528/373; 257/40; 438/99; 549/30

(56) References Cited

U.S. PATENT DOCUMENTS

| | | | |
|---|---|---|---|
| 5,069,823 A | * 12/1991 | Sato et al. | 252/500 |
| 5,347,144 A | * 9/1994 | Garnier et al. | 257/40 |
| 5,619,357 A | 4/1997 | Angelopoulos et al. | 349/110 |
| 5,777,070 A | 7/1998 | Inbasekaran et al. | 528/394 |
| 5,969,376 A | 10/1999 | Bao | 257/99 |
| 6,107,117 A | 8/2000 | Bao et al. | 438/99 |
| 6,150,191 A | 11/2000 | Bao | 438/99 |
| 6,242,561 B1 | * 6/2001 | Mohwald et al. | 528/377 |
| 6,320,200 B1 | * 11/2001 | Reed et al. | 257/40 |
| 6,445,126 B1 | * 9/2002 | Arai et al. | 313/504 |
| 2002/0053320 A1 | * 5/2002 | Duthaler et al. | 118/249 |
| 2002/0053666 A1 | * 5/2002 | Marks et al. | 257/40 |

FOREIGN PATENT DOCUMENTS

| EP | 0 852 403 A | 7/1998 |
|---|---|---|
| WO | WO 97/32914 A1 * | 9/1997 |
| WO | WO 02 090416 A | 11/2002 |

OTHER PUBLICATIONS

C. Berger, J.J. Prejean, "Evidence of a Spin–Glass Transition in the Quasicrystal $Al_{73}Mn_{21}Si_6$", Physical Review Letters, American Physical Society, NY, US, vol. 64, No. 15, Apr. 9, 1990, pp. 1769–1772.

D.J. Gundlach et al., "Pentacene organic thin film transistors—molecular ordering and mobility", IEEE Electron Device Lett., vol. 18, p. 87 (1997).

Z. Bao et al., "Soluble and processable regioregular poly(3–hexylthiophene) for field–effect thin film transistor application with high mobility", *Appl. Phys. Lett.* vol. 69, p 4108 (1996).

* cited by examiner

*Primary Examiner*—Erik Kielin
(74) *Attorney, Agent, or Firm*—Fay, Sharpe, Fagan, Minnich & McKee, LLP

(57) ABSTRACT

An electronic device containing a polythiophene

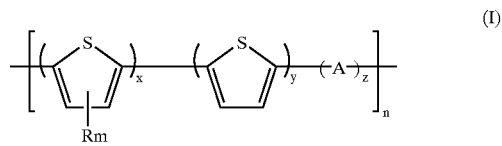

(I)

wherein R represents a side chain, m represents the number of R substituents; A is a divalent linkage; x, y and z represent, respectively, the number of $R_m$ substituted thienylenes, unsubstituted thienylenes, and divalent linkages A, respectively, in the monomer segment subject to z being 0 or 1, and n represents the number of repeating monomer segments in the polymer or the degree of polymerization.

19 Claims, 2 Drawing Sheets

POLYTHIOPHENES AND ELECTRONIC DEVICES GENERATED THEREFROM

COPENDING APPLICATIONS

Illustrated in copending applications U.S. Ser. No. 10/042,342, U.S. Ser. No. 10/042,356, U.S. Ser. No. 10/042,357, U.S. Ser. No. 10/042,359, U.S. Ser. No. 10/042,360, the disclosures of which are totally incorporated herein by reference, and filed concurrently herewith, all titled "Polythiophenes and Devices Thereof" and all filed Jan. 11, 2002, are polythiophenes and devices thereof. The appropriate components, processes thereof and uses thereof illustrated in those copending applications may be selected for the present invention in embodiments thereof.

BACKGROUND

The present invention is generally directed to polythiophenes and uses thereof. More specifically, the present invention in embodiments is directed to a class of polythiophenes wherein certain repeating thienylene units possess side chains, such as alkyl, which are arranged in a regioregular manner on the polythiophene backbone, and which polythiophenes are, for example, useful as active semiconductive materials for thin film field-effect transistors (FETs).

Semiconductive polymers like certain polythiophenes, which are useful as active semiconductor materials in thin film transistors (TFTs), have been reported. A number of these polymers have some solubility in organic solvents and are thus able to be fabricated as semiconductor channel layers in TFTs by solution processes, such as spin coating, solution casting, dip coating, screen printing, stamp printing, jet printing and the like. Their ability to be fabricated via common solution processes would render their manufacturing simpler and cost effective as compared to the costly conventional photolithographic processes typical of silicon-based devices such as hydrogenated amorphous silicon TFTs. Moreover, desired are transistors fabricated with polymer materials, such as polythiophenes, referred to as polymer TFTs, with excellent mechanical durability and structural flexibility, which may be highly desirable for fabricating flexible TFTs on plastic substrates. Flexible TFTs would enable the design of electronic devices which usually require structural flexibility and mechanical durability characteristics. The use of plastic substrates together with organic or polymer transistor components can transform the traditionally rigid silicon TFT into a mechanically more durable and structurally flexible polymer TFT design. The latter is of particular value to large area devices such as large-area image sensors, electronic paper and other display media. Also, the selection of polymer TFTs for integrated circuit logic elements for low end microelectronics, such as smart cards, radio frequency identification (RFID) tags, and memory/storage devices, may also greatly enhance their mechanical durability, and thus their useful life span. Nonetheless, many of the semiconductor polythiophenes are not, it is believed, stable when exposed to air as they become oxidatively doped by ambient oxygen, resulting in increased conductivity. The result is larger off-current and thus lower current on/off ratio for the devices fabricated from these materials. Accordingly, with many of these materials, rigorous precautions have to be undertaken during materials processing and device fabrication to exclude environmental oxygen to avoid or minimize oxidative doping. These precautionary measures add to the cost of manufacturing therefore offsetting the appeal of certain polymer TFTs as an economical alternative to amorphous silicon technology, particularly for large area devices. These and other disadvantages are avoided or minimized in embodiments of the present invention.

REFERENCES

A number of organic semiconductor materials has been described for use in field-effect TFTs, which materials include organic small molecules such as pentacene, see for example D. J. Gundlach et al., "Pentacene organic thin film transistors—molecular ordering and mobility", *IEEE Electron Device Lett.*, Vol. 18, p. 87 (1997), to oligomers such as sexithiophenes or their variants, see for example reference F. Garnier et al., "Molecular engineering of organic semiconductors: Design of self-assembly properties in conjugated thiophene oligomers", *Amer. Chem. Soc.*, Vol. 115, p. 8716 (1993), and certain polythiophenes, such as poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p4108 (1996). Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for transportability. However, most small molecule or oligomer-based devices rely on difficult vacuum deposition techniques for fabrication. Vacuum deposition is selected primarily because the small molecular materials are either insoluble or their solution processing by spin coating, solution casting, or stamp printing do not generally provide uniform thin films. In addition, vacuum deposition may also involve the difficulty of achieving consistent thin film quality for large area format. Polymer TFTs, such as those fabricated from regioregular polythiophenes of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, regioregular polythiophenes such as poly(3-alkylthiophene-2,5-diyl) are very sensitive to air. The TFTs fabricated from these materials in ambient conditions generally exhibit very large off-current, very low current on/off ratios, and their performance characteristics degrade rapidly.

References that may be of interest include U.S. Pat. Nos. 6,150,191; 6,107,117; 5,969,376; 5,619,357, and 5,777,070.

FIGURES

Illustrated in FIGS. 1 to 4 are various representative embodiments of the present invention and wherein polythiophenes are selected as the channel materials in thin film transistor (TFT) configurations.

SUMMARY AND EMBODIMENTS

It is a feature of the present invention to provide semiconductor polymers such as polythiophenes, which are useful for microelectronic device applications, such as TFT devices.

It is another feature of the present invention to provide polythiophenes with a band gap of from about 1.5 eV to about 3 eV as determined from the absorption spectra of thin films thereof, and which polythiophenes are suitable for use as TFT semiconductor channel layer materials.

In yet a further feature of the present invention there are provided polythiophenes which are useful as microelectronic components, and which polythiophenes have reasonable solubility of, for example, at least about 0.1 percent by weight in common organic solvents, such as methylene chloride, tetrahydrofuran, toluene, xylene, mesitylene, chlorobenzene, and the like, and thus these components can be economically fabricated by solution processes such as spin coating, screen printing, stamp printing, dip coating, solution casting, jet printing, and the like.

Another feature of the present invention resides in providing electronic devices, such as TFTs with a polythiophene channel layer, and which layer has a conductivity of from about $10^{-6}$ to about $10^{-9}$ S/cm (Siemens/centimeter).

Also, in yet another feature of the present invention there are provided polythiophenes and devices thereof, and which devices exhibit enhanced resistance to the adverse effects of oxygen, that is, these devices exhibit relatively high current on/off ratios, and their performance does not substantially degrade as rapidly as similar devices fabricated from regioregular polythiophenes such as regioregular poly(3-alkylthiophene-3,5-diyl).

Additionally, in a further feature of the present invention there is provided a class of polythiophenes with unique structural features which are conducive to molecular self-alignment under appropriate processing conditions, and which structural features also enhance the stability of device performance. Proper molecular alignment can permit higher molecular structural order in thin films, which can be important to efficient charge carrier transport, thus higher electrical performance.

There are disclosed in embodiments polythiophenes and electronic devices thereof. More specifically, the present invention relates to polythiophenes illustrated by or encompassed by Formula (I)

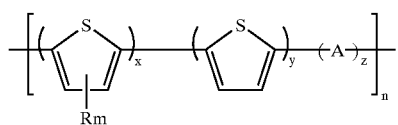

(I)

wherein, for example, R is a side chain comprising, for example, alkyl, alkyl derivatives, such as alkoxyalkyl; siloxy-subsituted alkyl, perhaloalkyl, such as a perfluoro, polyether, such as oligoethylene oxide, polysiloxy, and the like; A is a divalent linkage selected, for example, from the group consisting of arylene such as phenylene, biphenylene, phenanthrenylene, dihydrophenanthrenylene, fluorenylene, oligoarylene, methylene, polymethylene, dialkylmethylene, dioxyalkylene, dioxyarylene, oligoethylene oxide, and the like; m is the number of side chains, for example 1 or 2; x and y are the numbers of the R substituted thienylenes and the non-substituted thienylene moieties, respectively; and z is the number of divalent linkages and is usually 0 or 1; the relative positions of the R substituted and non-substituted thienylene moieties, and the divalent linkage; and n represents the number of segments. A in the monomer segment may be different from those presented in Formula (I), that is for example, polythiophenes (I) schematically represented by Formula (II) as semiconductor layers in TFT devices:

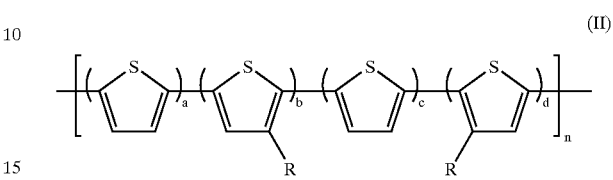

(II)

wherein R is a side chain comprised of, for example, alkyl derivatives, such as alkoxyalkyl, siloxy-subsituted alkyl, perhaloalkyl, such as perfluoro, polyether, such as oligoethylene oxide, polysiloxy derivatives, and the like; a is an integer (or number) of from about 0 to about 5; b, c, and d are integers of from about 1 to about 5; and n is the degree of polymerization, and can be from about 5 to over 5,000, and more specifically, from about 10 to about 1,000 wherein the number average molecular weight ($M_n$) of the polythiophenes can be, for example, from about 2,000 to about 100,000, and more specifically, from about 4,000 to about 50,000, and the weight average molecular weight ($M_w$) thereof can be from about 4,000 to about 500,000, and more specifically, from about 5,000 to about 100,000 both as measured by gel permeation chromatography using polystyrene standards. Examples of the side chains for the polythiophenes (I) and (II) include alkyl with, for example, from about 1 to about 25, and more specifically, from about 4 to about 12 carbon atoms (included throughout are numbers within the range, for example 4, 5, 6, 7, 8, 9, 10, 11 and 12), such as butyl, pentyl, hexyl, heptyl, octyl, nonyl, decyl, undecyl, dodecyl, isomeric forms thereof, mixtures thereof, and the like; alkoxyalkyl with, for example, from about 2 to about 30 carbon atoms, such as for example methoxypropyl, methoxybutyl, methoxyhexyl, methoxyhexyl, methoxyheptyl, and the like, polyether chains, such as polyethylene oxide; perhaloalkyl, such as perfluoroalkyl, polysiloxy chain, such as trialkylsiloxyalkyl derivatives, and the like.

Specific illustrative polythiophenes examples are wherein n is as illustrated herein.

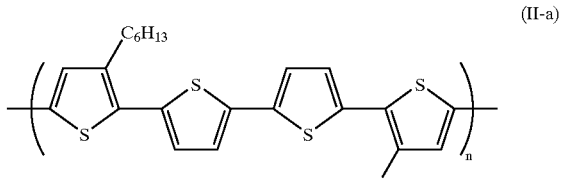

(II-a)

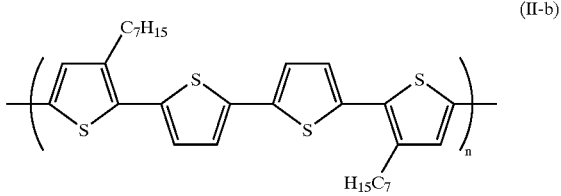

(II-b)

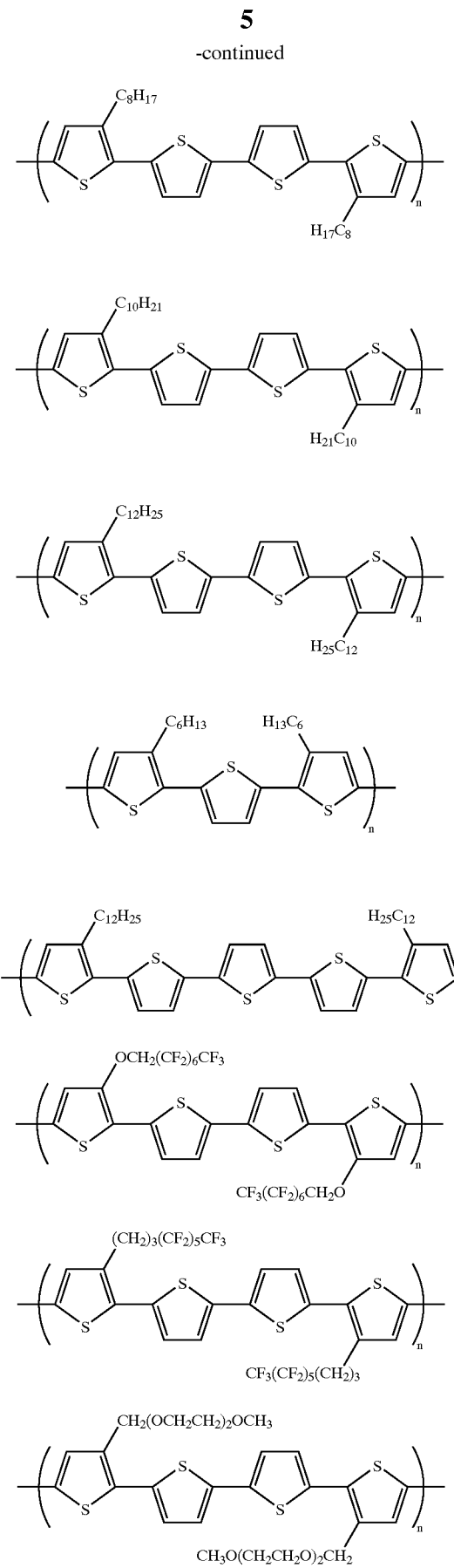
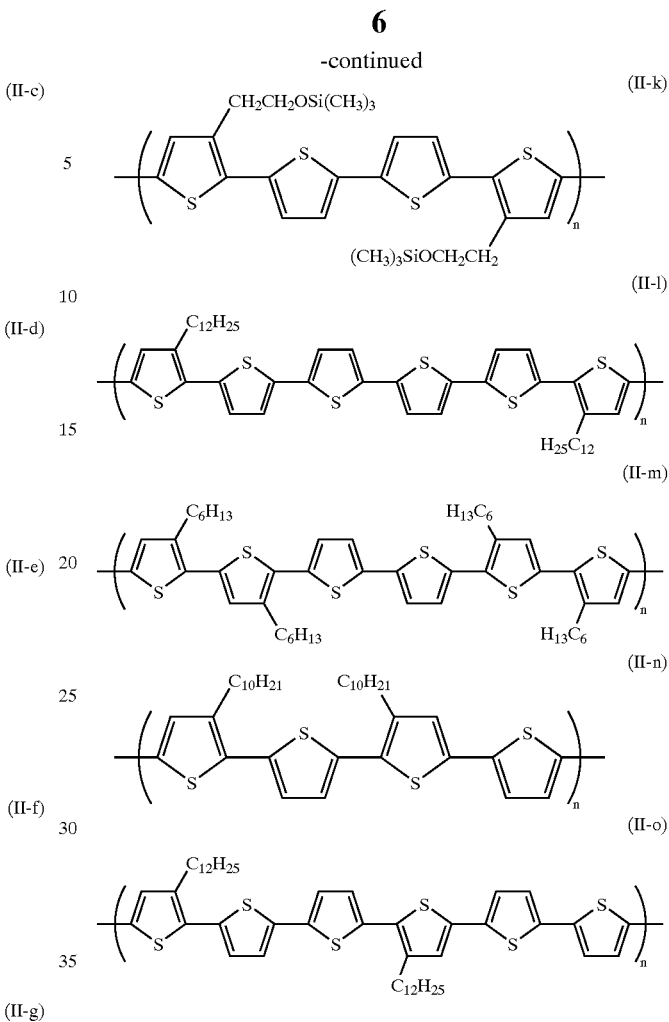

The polythiophenes in embodiments are soluble in common coating solvents, for example, in embodiments they possess a solubility of at least about 0.1 percent by weight, and more specifically, from about 0.5 percent to about 5 percent by weight in such solvents as methylene chloride, 1,2-dichloroethane, tetrahydrofuran, toluene, xylene, mesitylene, chlorobenzene, and the like. Moreover, the polythiophenes of the present invention in embodiments when fabricated as semiconductor channel layers in TFT devices provide a stable conductivity of, for example, from about $10^{-9}$ S/cm to about $10^{-6}$ S/cm, and more specifically, from about $10^{-8}$ S/cm to about $10^{-7}$ S/cm as determined by conventional four-probe conductivity measurements. Further, the polythiophenes (II) include side chains that are regioregularly positioned on the polythiophene backbone, reference Formulas m that follow, and in which four polymer chains of polythiophene (II-e) are schematically represented. The strategically positioned side chains in (II) facilitate proper alignment of side chains which enables formation of higher ordered microstructure domains in thin films. It is believed that these polythiophenes when fabricated from solutions as thin films of, for example, about 10 nanometers to about 500 nanometers form closely stacked lamella structures that are conducive to efficient charge carrier transport. The incorporated unsubstituted thienylene moieties in (II) have some degree of rotational freedom, which helps to disrupt the extended π-conjugation of the polythiophene system to an extent that is sufficient to suppress its propensity towards oxidative doping. Accordingly, these materials are more stable in ambient conditions and the devices fabricated from these polythiophenes are functionally more stable than that of regioregular polythiophenes such as regioregular poly(3-alkylthiophene-2,5-diyl). When unprotected, the aforementioned stable materials and devices are generally stable for a number of weeks rather than days or hours as is the situation with regioregular poly(3-alkylthiophene-2,5-diyl) after exposure to ambient oxygen, thus the devices fabricated from the polythiophenes in embodiments of the present invention can provide higher current on/off ratios, and their performance characteristics do not substantially change as rapidly as that of poly(3-alkylthiophene-2,5-diyl) when no rigorous procedural precautions have been taken to exclude ambient oxygen during material preparation, device fabrication, and evaluation. The polythiophene stability of the present invention in embodiments against oxidative doping, particularly for low cost device manufacturing, do not usually have to be handled in an inert atmosphere and the processes thereof are, therefore, simpler and more cost effective, and the fabrication thereof can be applied to large scale production processes.

FORMULAS III

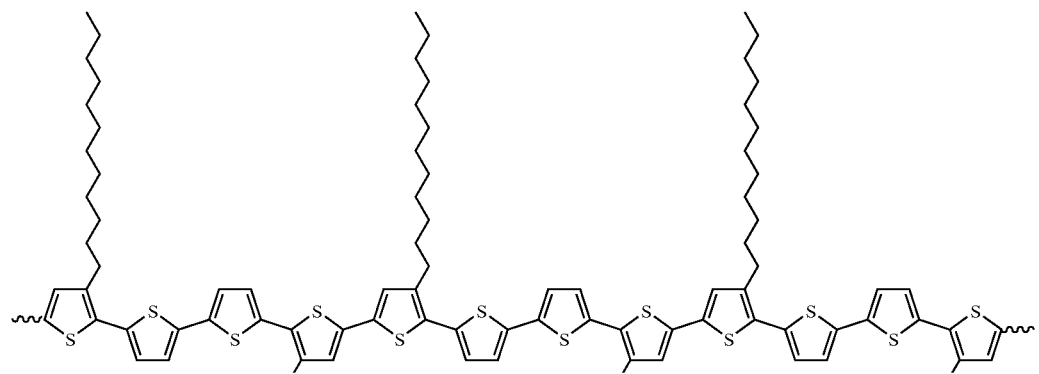

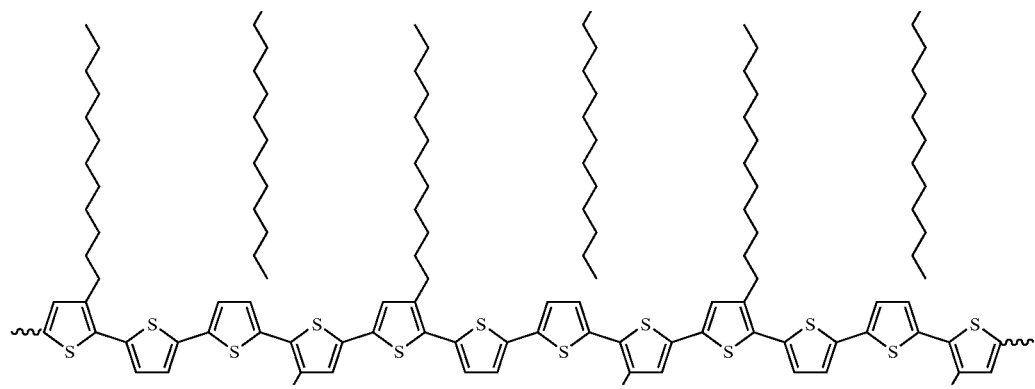

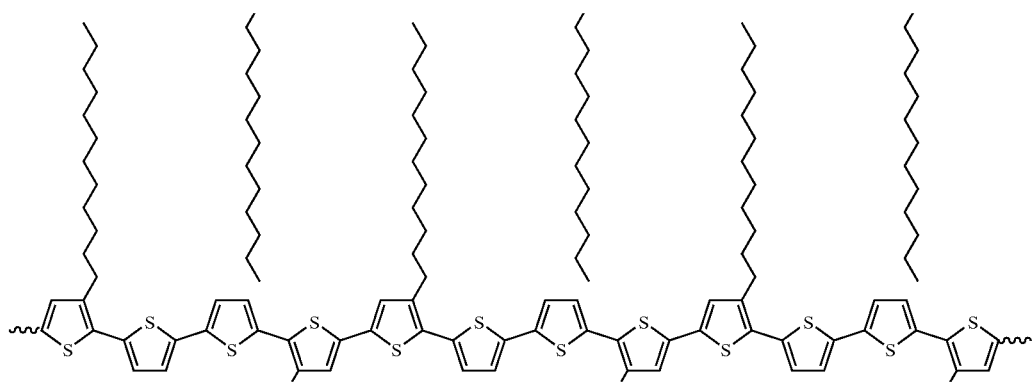

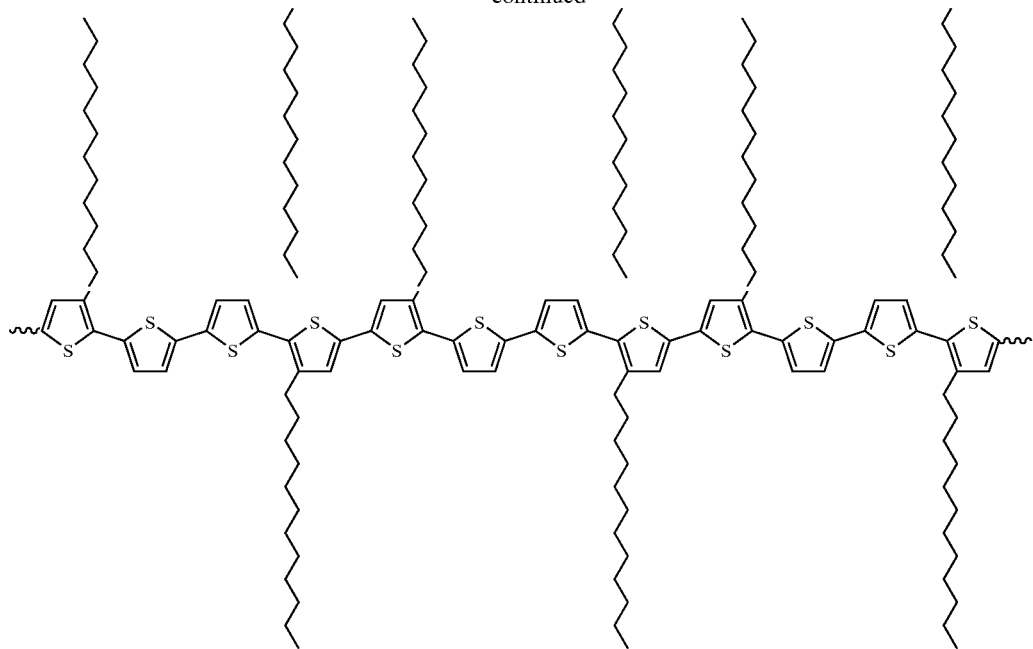

The preparation of polythiophenes of the present invention can be illustrated with reference to the preparation of polythiophene (IV) from a suitably constructed oligothiophene monomer, such as (IIIa) or (IIIb), according to the general processes depicted in Scheme 1. Polythiophene (IV) is a member of polythiophene (II) wherein a=0, b=d=1. Monomer (IIIa) can readily be obtained from the reaction of 3-R-thienyl-2-magnesiumbromide with 5,5'-dibromo-2,2'-dithiophene. Monomer (IIIa) or (IIIb) possess side chains which are strategically placed on the terminal thienylene units so that when polymerized the resultant polythiophene (IV) possesses side chains which are regioregularly positioned on its backbone. Unlike the preparation of regioregular polythiophenes, such as poly(3-alkylthiophene-2,5-diyl) which require regioregular coupling reaction, the polythiophenes of the present invention can be prepared by general polymerization techniques without regioregularity complications. Specifically, $FeCl_3$ mediated oxidative coupling of (IIIa) has been successfully utilized in the preparation of polythiophenes (IV).

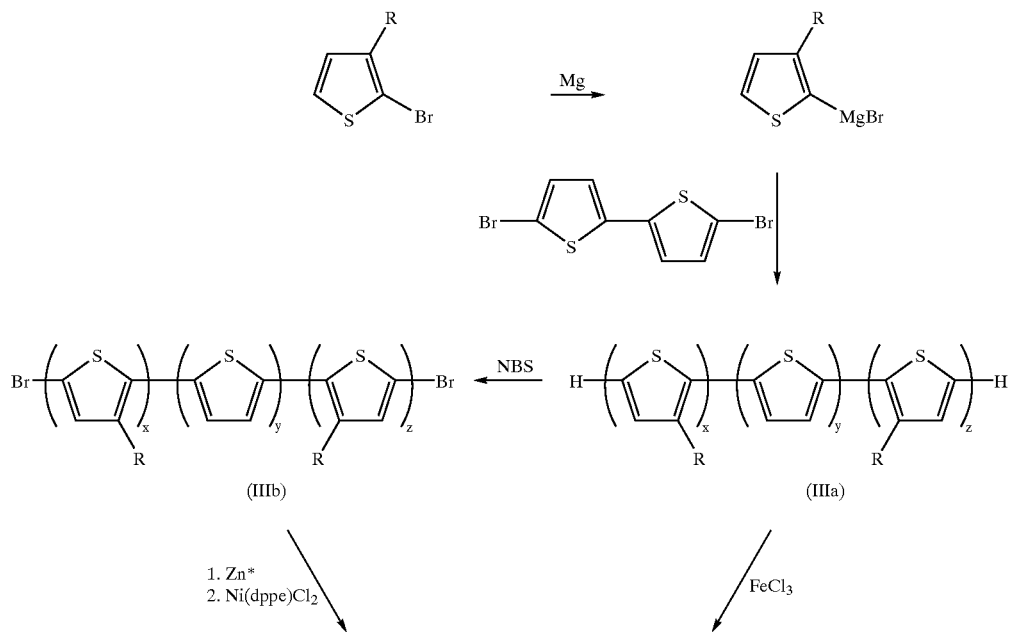

Scheme 1

-continued

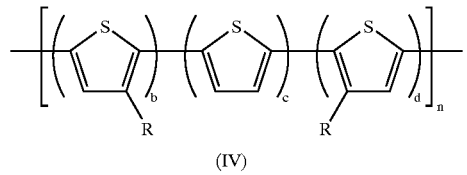

(IV)

NBS: N-Bromosuccinimide
Ni(dppe)Cl$_2$: [1,2-Bis(diphenylphosphinoethane)] dichloronickel (II)

The polymerization is generally conducted by adding a solution of 1 molar equivalent of (IIIa) in a chlorinated solvent, such as chloroform, to a suspension of about 1 to about 5 molar equivalents of anhydrous FeCl$_3$ in the same chlorinated solvent. The resultant mixture was permitted to react at a temperature of about 25° C. to about 60° C. under a blanket of dried air or with a slow stream of dried air bubbling through the reaction mixture for a period of about 30 minutes to about 48 hours. After the reaction, the polymer product can be isolated by washing the reaction mixture with water or a dilute aqueous hydrochloric acid solution, stirring with a dilute aqueous ammonium solution for a period of about 15 minutes to one hour, followed by washing with water, precipitation from a nonsolvent, and optionally extracting the polythiophene product via soxhlet extraction with appropriate solvents such as methanol, toluene, xylene, chlorobenzene, and the like. The polythiophene product thus obtained can be further purified by precipitation from a suitable solvent such as methanol or acetone.

Aspects of the present invention relate to an electronic device containing a polythiophene

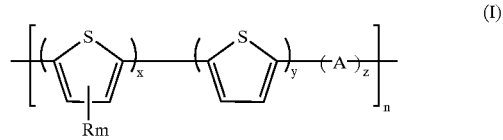

(I)

wherein R represents a side chain, m represents the number of R substituents; A is a divalent linkage; x, y and z represent, respectively, the number of R$_m$ substituted thienylenes, unsubstituted thienylenes, and divalent linkages A, respectively, in the monomer segment subject to z being 0 or 1, and n represents the number of repeating monomer segments in the polymer or the degree of polymerization; a device which is a thin film transistor (TFT) comprised of a substrate, a gate electrode, a gate dielectric layer, a source electrode and a drain electrode, and in contact with the source/drain electrodes and the gate dielectric layer semiconductor a layer comprised of polythiophene wherein R is alkoxyalkyl, siloxy-subsituted alkyl, a perhaloalkyl, or a polyether; A is a divalent linkage selected from the group consisting of arylene of about 6 to about 40 carbon atoms; m is 1 or 2; x and y are the number of the R substituted thienylenes and the unsubstituted thienylene moieties, respectively, each of which are from 1 to 5; z is zero or 1, and represents the number of divalent linkages; and n represents the number of monomer segments; a device wherein n is from about 5 to about 5,000; the number average molecular weight (M$_n$) of the polythiophene is from about 2,000 to about 100,000; the weight average molecular weight (M$_w$) is from about 4,000 to over 500,000, both M$_w$ and M$_n$ being measured by gel permeation chromatography using polystyrene standards; a device wherein R is alkyl containing from 1 to about 20 carbon atoms, and wherein n is from about 10 to about 1,000; the M$_n$ is from about 4,000 to about 50,000; and the M$_w$ is from about 5,000 to about 100,000; a device wherein the alkyl side chain R contains from 6 to about 12 carbon atoms; a device wherein the alkyl side chain R is butyl, pentyl, hexyl, heptyl, octyl, nonyl, decyl, undecyl, or dodecyl; a device wherein the side chain R is a perfluoroalkyl of about 2 to about 15 carbon atoms; a device wherein the side chain R is siloxyalkyl of trimethylsiloxyalkyl, triethylsiloxyalkyl, and wherein alkyl optionally contains from about 4 to about 10 carbons, and which alkyl is butyl, pentyl, hexyl, heptyl, or octyl; a device wherein the divalent linkage A is an arylene with from about 6 to about 40 carbon atoms; a TFT device wherein the divalent linkage A is selected from the group consisting of phenylene, biphenylene, phenanthrenylene, 9,10-dihydrophenanthrenylene, fluorenylene, methylene, polymethylene, dioxyalkylene, dioxyarylene, and oligoethylene oxide; a thin film transistor containing said polythiophene is represented by

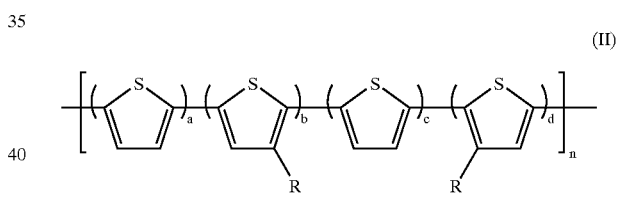

(II)

wherein R is a side chain; a, b, c, and d represent the number of thienylene moieties; and n is the degree of polymerization; a device wherein R is alkyl containing from about 1 to about 20 carbon atoms; a device wherein R is alkyl containing from about 6 to about 12 carbon atoms; a device wherein R is butyl, pentyl, hexyl, heptyl, octyl, nonyl, decyl, undecyl, or dodecyl; a device wherein b and d are from about 1 to about 5; a device wherein b and d are from about 1 to about 3; a device wherein a is from about 0 to about 5, and c is about 1 to about 5, or wherein a is about 0 to about 3, and c is about 1 to about 3; a thin film transistor containing a polythiophene represented by Formula (IV)

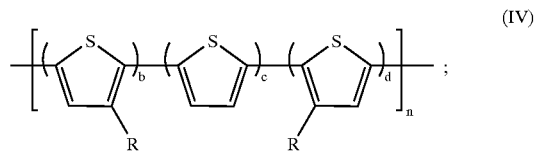

(IV)

a thin film transistor device containing a polythiophene selected from the group consisting of polythiophenes (II-a) through (II-o)

(II-a)
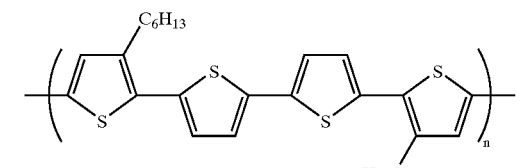
(II-b)
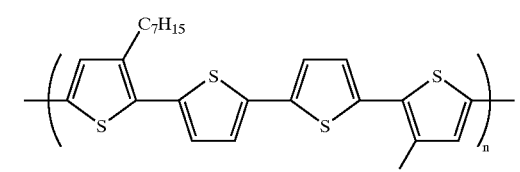
(II-c)
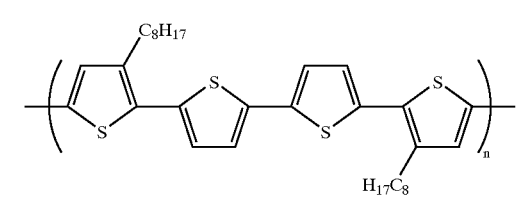
(II-d)
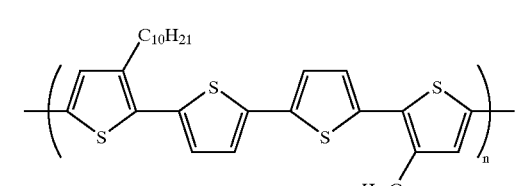
(II-e)
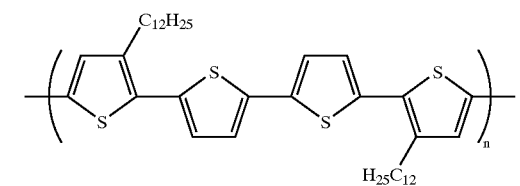
(II-f)
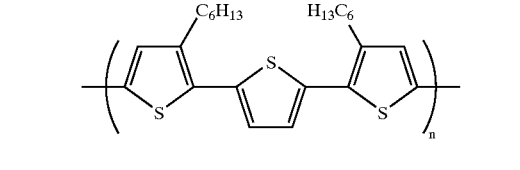
(II-g)
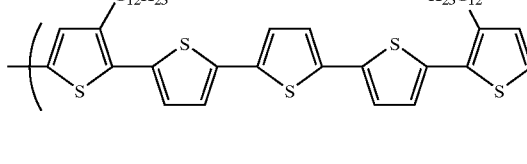
(II-h)
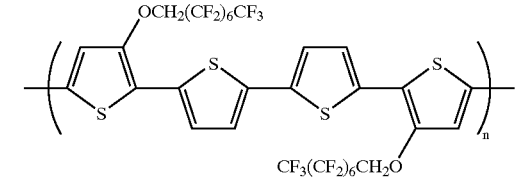
(II-i)
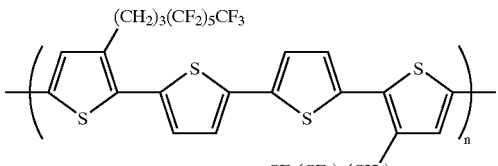
(II-j)
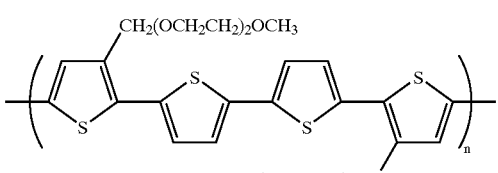
(II-k)
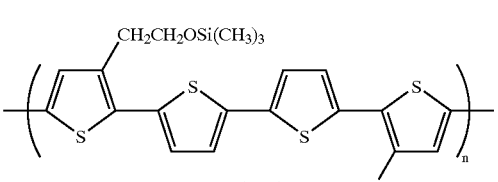
(II-l)
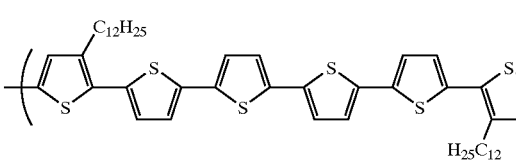
(II-m)
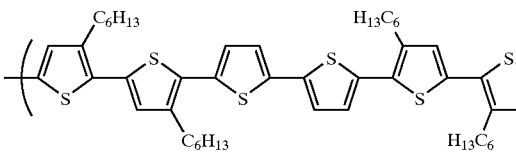
(II-n)
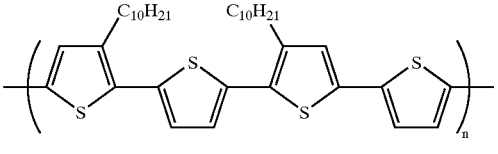
(II-o)
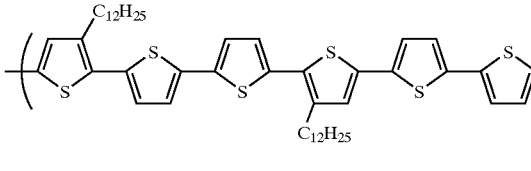
a thin film transistor containing a polythiophene selected from the group consisting of (II-a) through (II-e)
(II-a)
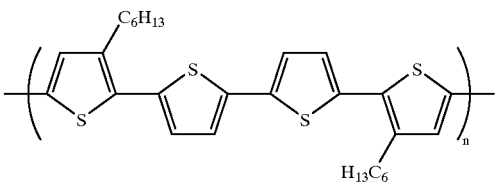

-continued

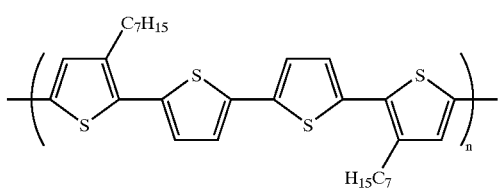
(II-b)

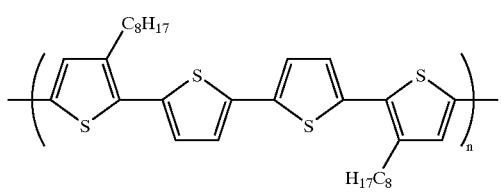
(II-c)

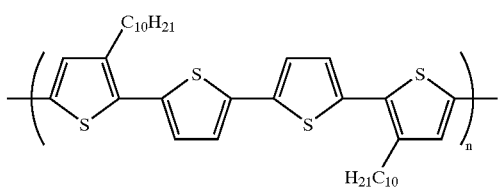
(II-d)

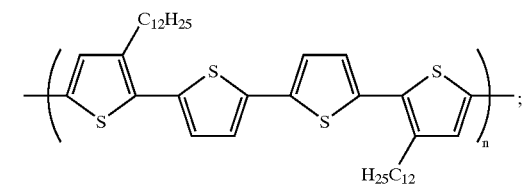
(II-e)

a thin film transistor containing a polythiophene selected from the group consisting of (II-a) through (II-e)

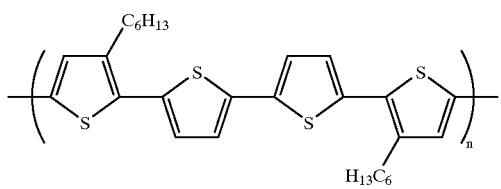
(II-a)

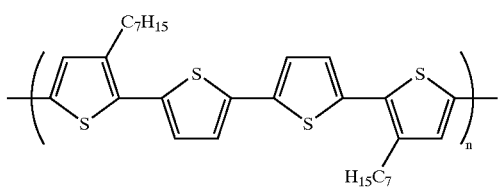
(II-b)

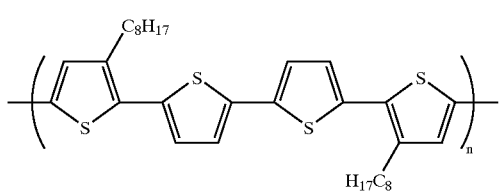
(II-c)

-continued

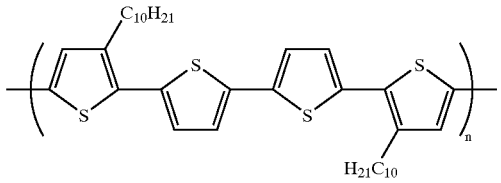
(II-d)

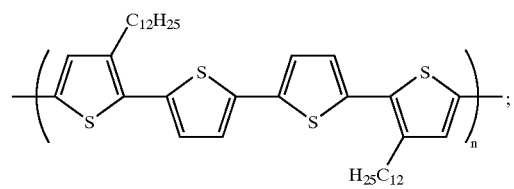
(II-e)

a device wherein n is a number of from about 5 to about 3,000; a device wherein n is a number of from about 5 to about 3,000; a device wherein n is a number of from about 5 to about 5,000; a device wherein R is hexyl, heptyl, octyl, nonyl, decyl, undecyl, dodecyl, tridecyl, tetradecyl, or pentadecyl, and the like; and m=1, x=y=2, z=0 or 1; a device wherein R is hexyl, heptyl, octyl, octyl, nonyl, decyl, undecyl, dodecyl, tridecyl, tetradecyl, or pentadecyl, and m=1, x=y=2, and z=0 or 1; a device wherein the polythiophene selected possesses a $M_n$ of from about 2,000 to about 100,000, and a $M_w$ of from about 4,000 to about 500,000; a device wherein the polythiophene possesses a $M_n$ of from about 2,000 to about 100,000, and a $M_w$ of from about 4,000 to about 1,000,000; a device wherein the polythiophene is selected from the group consisting of (II-a) through Formula (II-e), and wherein n is a number of from about 50 to about 3,000

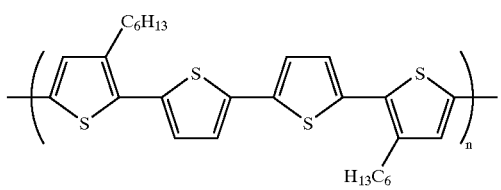
(II-a)

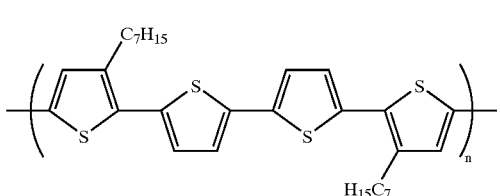
(II-b)

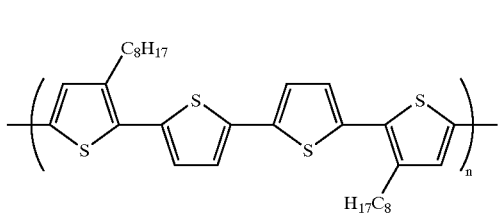
(II-c)

-continued

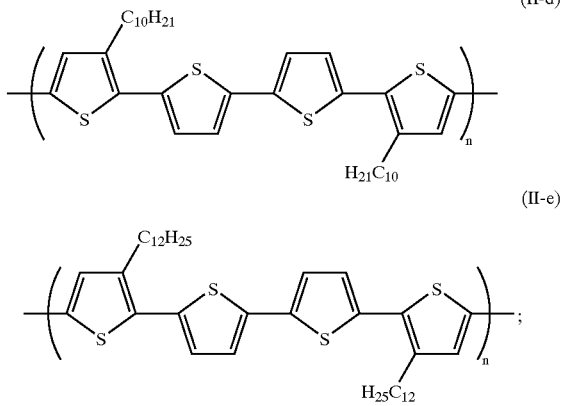

a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the polythiophene layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is organic polymer or inorganic oxide particle-polymer composite; device or devices include electronic devices such as TFTs.

Figure 1:
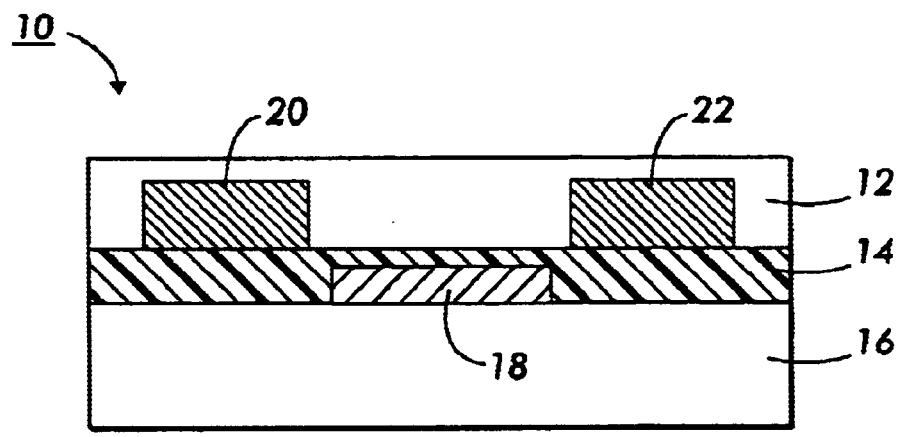
In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 with the gate electrode having a portion thereof or the entire gate in contact with the dielectric layer 14 on top of which layer 14 two metal contacts, 20 and 22 (source and drain electrodes), are deposited. Over and between the metal contacts 20 and 22 is the polythiophene semiconductor layer 12. The gate electrode can be included in the substrate, in the dielectric layer, and the like throughout.
Figure 2:
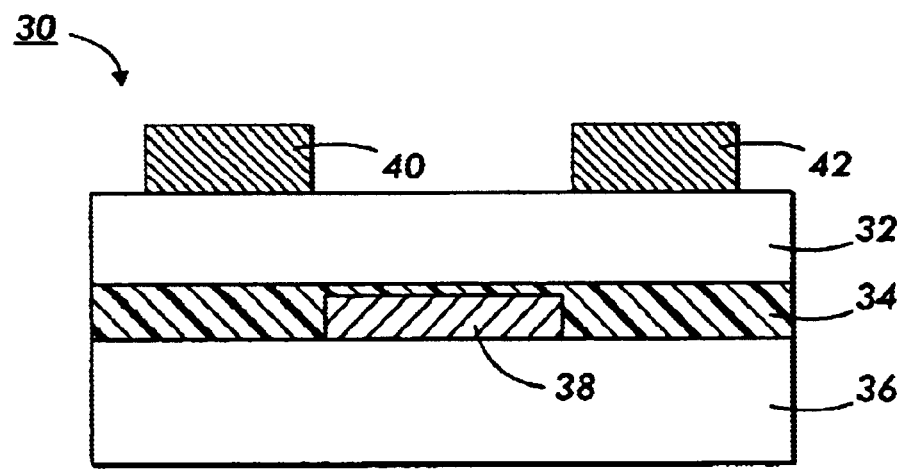
FIG. 2 schematically illustrates another TFT configuration 30 comprised of a substrate 36, a gate electrode 38, a source electrode 40, and a drain electrode 42, an insulating dielectric layer 34, and the polythiophene semiconductor layer 32.

Also, other devices not disclosed, especially TFT devices, are envisioned, reference for example known TFT devices.

In some embodiments of the present invention, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present invention and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers especially for a flexible plastic substrate and from about 1 to about 10 millimeters for a rigid substrate such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the polythiophenes illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the polythiophenes of the present invention.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG available from Acheson Colloids Company and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is about, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters, with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +10 volts to about −80 volts is applied to the gate electrode.

Other known materials not recited herein for the various components of the TFT devices of the present invention can also be selected in embodiments.

The following Examples are provided.

Figure 3:
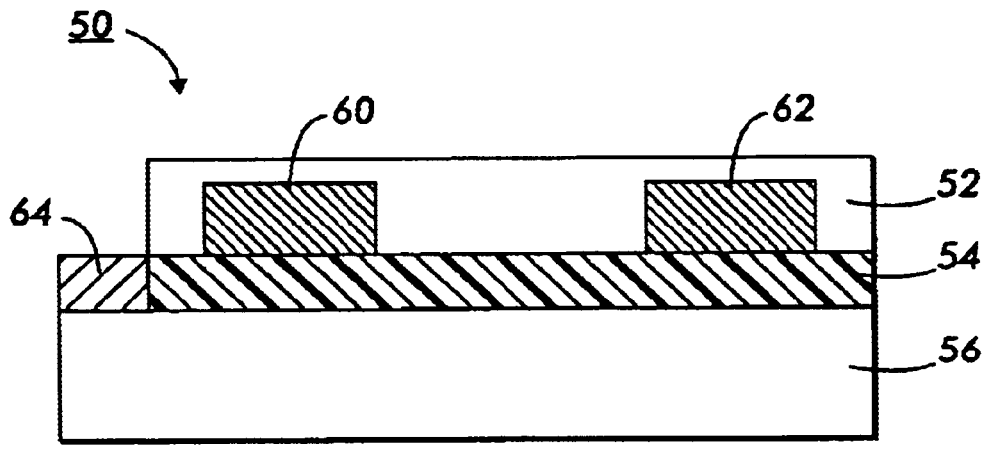
FIG. 3 schematically illustrates a further TFT configuration 50 comprised of a heavily n-doped silicon wafer 56, which can act as a gate electrode, a thermally grown silicon oxide dielectric layer 54, the polythiophene semiconductor layer 52, on top of which are deposited a source electrode 60 and a drain electrode 62.
Figure 4:
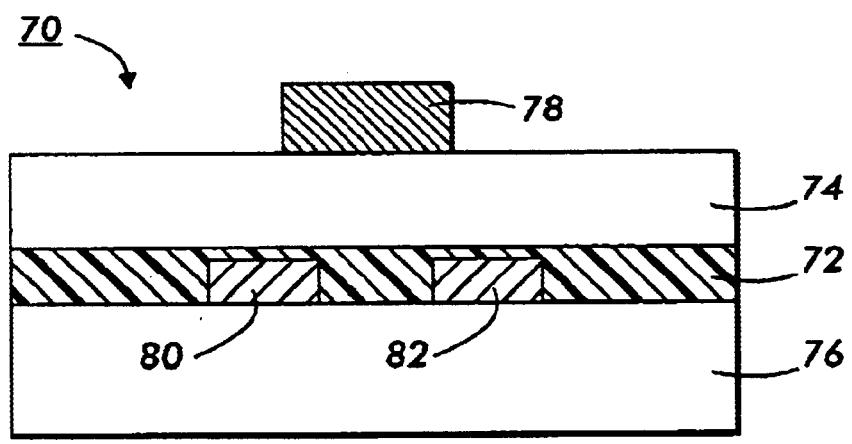
FIG. 4 schematically illustrates a TFT configuration 70 comprised of substrate 76, a gate electrode 78, a source electrode 80, a drain electrode 82, the polythiophene semiconductor layer 72, and an insulating dielectric layer 74.

General Procedure a) Device Fabrication:

There was selected a top-contact thin film transistor configuration as schematically illustrated, for example, in FIG. 3.

The test device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$ (nanofarads/square centimeter). The fabrication of the device was accomplished at ambient conditions without any precautions to exclude the materials and device from exposure to ambient oxygen, moisture, or light. The silicon wafer was first cleaned with methanol, air dried, and then immersed in a 0.01 M solution of 1,1,1,3,3,3-hexamethyldisilazane in dichloromethane for 30 minutes at room temperature, about 23° C. to about 25° C. Subsequently, the wafer was washed with dichloromethane and dried. The test semiconductor polythiophene layer of about 30 nanometers to 100 nanometers in thickness was then deposited on top of the silicon oxide dielectric layer by spin coating at a speed of 1,000 rpm for about 35 seconds, and dried in vacuo at 80° C. for 20 hours. The solution used in fabricating the semiconductor layer was comprised of 1 percent by weight of the polythiophene in an appropriate solvent, and was filtered through a 0.45 $\mu$m filter before use. Thereafter, the gold source and drain electrodes were deposited on top of the semiconductor polythiophene layer by vacuum deposition through a shadow mask with various channel lengths and widths, thus creating a series of transistors of various dimensions. For consistency, the devices after fabrication were kept in a dry atmosphere of about 30 percent relative humidity in the dark before and after evaluation.

b) TFT Device Characterization:

The evaluation of field-effect transistor performance was accomplished in a black box at ambient conditions using a Keithley 4200 SCS semiconductor characterization system. The carrier mobility, $\mu$, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of field-effect transistor is its current on/off ratio. This is the ratio of the saturation source-drain current when the gate voltage $V_G$ is equal to or greater than the drain voltage $V_D$ to the source-drain current when the gate voltage $V_G$ is zero.

COMPARATIVE EXAMPLE

A series of comparative thin film transistors were fabricated with the known regioregular polythiophene, poly(3-hexythiophene-2,5-diyl), which is commonly known as P3HT. This material was purchased from Aldrich Chemical and was purified by three successive precipitations of its solution in chlorobenzene from methanol.

The devices were fabricated in ambient conditions in accordance with the above procedure. Using transistors with a dimension of W=5,000 $\mu$m and L=60 $\mu$m, the following average properties from at least five transistors were obtained:

| | |
|---|---|
| Mobility: | 1 to 1.2 × 10$^{-2}$ cm$^2$/V.sec |
| Initial on-off ratio: | 1.5 to 2.1 × 10$^3$ |
| On-off ratio after 5 days: | 5 to 10 |

The observed low initial current on/off ratios are an indication of the propensity of poly(3-hexythiophene-2,5-diyl) towards oxidative doping, that is the instability of poly(3-hexythiophene-2,5-diyl) in the presence of ambient oxygen. The drastic reductions in the current on/off ratios over just a five-day period further confirm the functional instability of poly(3-hexythiophene-2,5-diyl) in ambient conditions.

EXAMPLE (a) Synthesis of Poly[5,5'-bis(3-dodecyl-2-thienyl)-2,2'-dithiophene] (IIe)

The monomer 5,5'-bis(3-dodecyl-2-thienyl)-2,2'-dithiophene for the preparation of (IIe) was synthesized as follows:

A solution of 2-bromo-3-dodecylthiophene (11.5 grams, 34.92 mmol) in 40 milliliters of anhydrous tetrahydrofuran (THF) was added slowly over a period of 20 minutes to a mechanically stirred suspension of magnesium turnings (1.26 grams, 51.83 mmol) in 10 milliliters of THF (tetrahydrofuran) in a 100 milliliter round-bottomed flask under an inert argon atmosphere. The resultant mixture was stirred at room temperature of about 22° C. to 25° C. for 2 hours, and then at 50° C. for 20 minutes before cooling down to room temperature. The resultant mixture was then added via a cannula to a mixture of 5,5'-dibromo-2,2'-dithiophene (4.5 grams, 13.88 mmol) and [1,3-bis(diphenylphosphino] dichloronickel (II) (0.189 gram, 0.35 mmol) in 80 milliliters of anhydrous THF in a 250 milliliter round-bottomed flask under an inert atmosphere, and refluxed for 48 hours. Subsequently, the reaction mixture was diluted with 200 milliliters of ethyl acetate, was washed twice with water and with a 5 percent aqueous hydrochloric acid (HCl) solution, and dried with anhydrous sodium sulfate. A dark brown syrup, obtained after evaporation of the solvent, was purified by column chromatography on silica gel yielding 5,5'-bis (3-dodecyl-2-thienyl)-2,2'-dithiophene as a yellow crystalline product in 55 percent yield, m.p. 58.9° C.

The NMR spectrum of the above obtained compound was recorded at room temperature using a Bruker DPX 300 NMR spectrometer:

$^1$H NMR (CDCl$_3$): δ 7.18 (d, J=5.4 Hz, 2H), 7.13 (d, J=3.6 Hz, 2H), 7.02 (d, J=3.6 Hz, 2H), 6.94 (d, J=5.4 Hz, 2H), 2.78 (t, 4H), 1.65 (q, 1.65, 4H), 1.28 (bs, 36H), 0.88 (m, 6H).

The polymerization of 5,5'-bis(3-dodecyl-2-thienyl)-2,2'-dithiophene was achieved by the FeCl$_3$-mediated oxidative coupling reaction as follows:

A solution of 5,5'-bis(3-dodecyl-2-thienyl)-2,2'-dithiophene (0.50 gram, 0.75 mmol) in 7 milliliters of chloroform was added slowly over a period of about 10 minutes to a well stirred mixture of FeCl$_3$ (0.40 gram, 2.47 mmol) in 3 milliliters of chloroform in a 50 milliliter round-bottomed flask in a dry atmosphere. The resultant mixture was heated at 50° C. for 1 hour, then 40° C. for 24 hours under a blanket of dry air. After the polymerization, the mixture was diluted with 20 milliliters of toluene and washed three times with water. The separated organic phase was stirred with 200 milliliters of 7.5 percent of an aqueous ammonia solution for half an hour, washed three times with water, and then poured into methanol to precipitate the crude polythiophene product. The latter was purified by soxhlet extraction with methanol, hexane, and chlorobenzene, $M_w$ 27,300; $M_n$ 16,900 relative to polystyrene standards.

Thin film transistor devices were fabricated as indicated herein using the following polythiophenes by spin coating a 1 percent by weight solution of a polythiophene in chlorobenzene and drying in vacuo at 80° C. for 20 hours. No precautions were taken to exclude ambient oxygen, moisture or light during device fabrication. Using the transistors with dimension of W=5,000 μm and L=60 μm, the following average properties from at least five separate transistors for each polythiophene are summarized in Table 1.

TABLE 1

| Polythiophene (IIe) $M_w$ ($M_n$) | Reaction/Purification Conditions | Mobility (Cm$^2$/V.Sec) | Initial Current On/Off Ratio | Current On/Off Ratio After 5 Days |
|---|---|---|---|---|
| 3,890 (3,880) | 25° C. (24 hours); Precipitated from methanol | 0.9–2.0 × 10$^{-4}$ | 1.2 × 10$^3$ | — |
| 14,900 (9,000) | 40° C. (1 hour), then 25° C. (48 hours); Extracted with toluene | 2.0–3.1 × 10$^{-4}$ | 2.2–4.7 × 10$^3$ | — |
| 14,900 (9,000) Device 2 further annealed at 135° C. for 10 min | 40° C. (1 hour), then 25° C. (48 hours); Extracted with toluene | 1.1–3.4 × 10$^{-3}$ | 4.5–9.0 × 10$^4$ | 0.7–1.1 × 10$^4$ |
| 19,000 (11,400) | 40° C. (24 hours), then 25° C. (24 hours); Extracted with methanol, hexane, then chlorobenzene | 1.9–8.7 × 10$^{-3}$ | 5.0–8.5 × 10$^5$ | 1.0–2.5 × 10$^5$ |
| 27,300 (16,900) | 50° C. (1 hour), then 40° C. (24 hours); Extracted with methanol, hexane, then chlorobenzene | 0.9–2.0 × 10$^{-2}$ | 1.0–5.1 × 10$^6$ | 1.9–3.2 × 10$^5$ |

Further, the average current on/off ratio for the devices using the invention polythiophene with a $M_w$ of 27,300 after 40 days was, for example, about 1×10$^5$.

The stability of the polythiophene semiconductor layer of the present invention was demonstrated, for example, by the high initial current on/off ratios and the slow reductions in the current on/off ratios of the devices.

Other embodiments and modifications of the present invention may occur to those skilled in the art subsequent to a review of the information presented herein; these embodiments and modifications, equivalents thereof, substantial equivalents thereof, or similar equivalents thereof are also included within the scope of this invention.

What is claimed is:

1. An electronic device containing a regioregular polythiophene

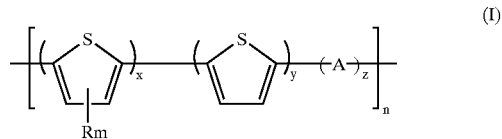

wherein R represents a side chain, m represents the number of R substituents; A is a divalent linkage; x, y and z represent, respectively, the number of $R_m$ substituted thienylenes, unsubstituted thienylenes, and divalent linkages A in the monomer segment subject to z being 0 or 1, and n represents the number of repeating monomer segments in the polymer or the degree of polymerization; and wherein the side chain R is a siloxyalkyl of trimethylsiloxyalkyl, or triethylsiloxyalkyl, and wherein the alkyl portion optionally contains from about 4 to about 10 carbon atoms, and which alkyl is butyl, pentyl, hexyl, heptyl, or octyl.

2. A device in accordance with claim 1, wherein the polythiophene has a number average molecular wieght (Mn) of from about 2,000 to about 100,000.

3. A device in accordance with claim 1, wherein the polythiophene has a weight average molecular weight ($M_w$) of from about 4,000 to over 500,000.

4. A device in accordance with claim 1, wherein n is from about 5 to about 5,000.

5. A device in accordance with claim 1, wherein the divalent linkage A is selected from the group consisting of arylene of about 6 to about 40 carbon atoms.

6. A device in accordance with claim 5, wherein the divalent linkage A is selected from the group consisting of phenylene, biphenylene, phenanthrenylene, 9,10-dihydrophenonthrenylene, fluorenylene, methylene, polymethylene, dioxyalkylene, dioxyarylene, and oligoethylene oxide.

7. An electronic device containing a regioregular polythiophene

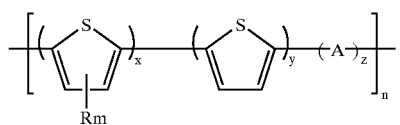
(I)

wherein R is a siloxyalkyl of trimethylsiloxyalkyl or triethylsiloxyalkyl, m represents the number of R substituents; A is a divalent linkage; x, y and z represent, respectively, the number of $R_m$ substituted thienylenes, unsubstituted thienylenes, and divalent linkages A in the monomer segment subject to z being 0 or 1, and n represents the number of repeating monomer segments in the polymer or the degree of polymerization.

8. A device in accordance with claim 7 wherein said alkyl contains from about 4 to about 10 carbon atoms.

9. A device in accordance with claim 7 wherein alkyl is butyl, pentyl, hexyl, heptyl or octyl.

10. A device in accordance with claim 7, wherein the polythiophene has a number average molecular wieght (Mn) of from about 2,000 to about 100,000.

11. A device in accordance with claim 7, wherein the polythiophene has a weight average molecular weight ($M_w$) of from about 4,000 to over 500,000.

12. A device in accordance with claim 7, wherein n is from about 5 to about 5,000.

13. A device in accordance with claim 7, wherein the divalent linkage A is selected from the group consisting of arylene of about 6 to about 40 carbon atoms.

14. A device in accordance with claim 13, wherein the divalent linkage A is selected from the group consisting of phenylene, biphenylene, phenanthrenylene, 9,10-dihydrophenonthrenylene, fluorenylene, methylene, polymethylene, dioxyalkylene, dioxyarylene, and oligoethylene oxide.

15. An electronic device containing a regioregular polythiophene

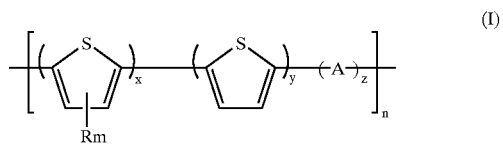
(I)

wherein R is a siloxyalkyl of trimethylsiloxyalkyl or triethylsiloxyalkyl, m represents the number of R substituents; A is a divalent linkage; x, y and z represent, respectively, the number of $R_m$ substituted thienylenes, unsubstituted thienylenes, and divalent linkages A in the monomer segment subject to z being 0 or 1, and n represents the number of repeating monomer segments in the polymer or the degree of polymerization, said polythiophene having a number average molecular weight ($M_n$) of from about 2,000 to about 100,000 and a weight average molecular weight ($M_w$) of from about 4,000 to over 500,000, both $M_w$ and $M_n$ being measured by gel permeation chromotography using polystyrene standards.

16. A device in accordance with claim 15 wherein said alkyl portion contains from about 4 to about 10 carbon atoms.

17. A device in accordance with claim 16 wherein said alkyl is butyl, pentyl, hexyl, heptyl or octyl.

18. A device in accordance with claim 15, wherein the divalent linkage A is selected from the group consisting of arylene of about 6 to about 40 carbon atoms.

19. A device in accordance with claim 18, wherein the divalent linkage A is selected from the group consisting of phenylene, biphenylene, phenanthrenylene, 9,10-dihydrophenonthrenylene, fluorenylene, methylene, polymethylene, dioxyalkylene, dioxyarylene, and oligoethylene oxide.

* * * * *

UNITED STATES PATENT AND TRADEMARK OFFICE
CERTIFICATE OF CORRECTION

PATENT NO. : 6,770,904 B2
DATED : August 3, 2004
INVENTOR(S) : Ong et al.

It is certified that error appears in the above-identified patent and that said Letters Patent is hereby corrected as shown below:

Column 1,
Line 16, insert the following section:
-- STATEMENT REGARDING FEDERALLY SPONSORED RESEARCH OR DEVELOPMENT This invention was made with United States Government support under Cooperative Agreement No. 70NANBOH3033 awarded by the National Institute of Standards and Technology (NIST). The United States Government has certain rights in the invention. --.

Signed and Sealed this

Twenty-second Day of November, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,770,904 B2 | Page 1 of 1 |
| APPLICATION NO. | : 10/042358 | |
| DATED | : August 3, 2004 | |
| INVENTOR(S) | : Ong et al. | |

It is certified that error appears in the above-identified patent and that said Letters Patent is hereby corrected as shown below:

In the Specification

Column 1,
Line 16, insert the following section:
-- STATEMENT REGARDING FEDERALLY SPONSORED RESEARCH OR DEVELOPMENT This invention was made with United States Government support under Cooperative Agreement No. 70NANB0H3033 awarded by the National Institute of Standards and Technology (NIST). The United States Government has certain rights in the invention. --.

This certificate supersedes the Certificate of Correction issued November 22, 2005.

Signed and Sealed this
Seventeenth Day of September, 2013

Teresa Stanek Rea
*Deputy Director of the United States Patent and Trademark Office*